United States Patent [19]
Boros

[11] Patent Number: 4,509,095
[45] Date of Patent: Apr. 2, 1985

[54] FLEXIBLE CIRCUIT BOARD INTERCONNECT HAVING LOW THERMAL CONDUCTIVITY

[75] Inventor: John Boros, Irvine, Calif.

[73] Assignee: Rockwell International Corporation, El Segundo, Calif.

[21] Appl. No.: 356,069

[22] Filed: Mar. 8, 1982

[51] Int. Cl.³ ............................................. H05K 7/20
[52] U.S. Cl. .................................. 361/386; 339/17 F; 361/398
[58] Field of Search ................. 174/84 R, 88 R, 94 R, 174/68.5; 339/17 F, 112 R, 278 C; 361/386, 398, 412, 413; 228/122; 219/462

[56] References Cited

U.S. PATENT DOCUMENTS

| | | | |
|---|---|---|---|
| 3,213,404 | 10/1965 | Hedstrom | 174/88 R |
| 3,290,756 | 12/1966 | Dreyer | 361/398 |
| 3,688,245 | 8/1972 | Lockshaw | 339/278 C |
| 4,104,728 | 8/1978 | Kasubuchi | 361/398 |

Primary Examiner—A. D. Pellinen
Assistant Examiner—Gregory D. Thompson
Attorney, Agent, or Firm—H. Fredrick Hamann; S. Alfred Uchizono

[57] ABSTRACT

The invention is directed to an apparatus adapted for flexible electrical interconnection between first and second rigid circuit systems, the systems being desirably isolated thermally from each other against heat energy tending undesirably to transfer between the systems, comprising in combination, a first flexible electrical conductor extending outwardly of the first circuit system to terminate in a first end, a second flexible electrical conductor extending outwardly of the second circuit system to terminate in a second end, and a third flexible electrical conductor bridging at least the first and second ends to provide the flexible electrical interconnection between the first and second systems and characterized by low thermal conductivity relative to at least one of the first and second conductors to thermally isolate the systems. Also included are methods for providing the flexible electrical interconnection between first and second rigid circuit systems.

11 Claims, 12 Drawing Figures

FLEXIBLE CIRCUIT BOARD INTERCONNECT HAVING LOW THERMAL CONDUCTIVITY

The invention described herein was made in the course of or under a contract or subcontract thereunder, with the Department of Army.

FIELD OF THE INVENTION

This invention relates to apparatus for, and a method of, limiting the transfer of heat energy from one electrical circuit system at one temperature to another circuit system desirably maintained at a different temperature. More particularly, the invention relates to the unique use of a low thermal conductivity portion of electrical path between the circuit systems.

PRIOR ART

In certain types of electro-optical sensor systems, the detector or image-sensing device is operated at cryogenic temperatures. Coupling signals to and from these devices frequently requires electrical interconnection to other portions of the sensor system which are relatively warm. Therefore, the electrical path between the cold and relatively warm electronics is required to be of a low thermal conductivity material to avoid the undesired transfer of heat energy from the warm to the cold electronics along that path, while maintaining acceptable levels of electrical conductivity along that same path.

Certain sensor systems can be designed to use what is commonly referred to as "rigid-flexible" or "rigid-flex" or "hard-flex" multilayer boards to achieve low weight, high package density and overall reliability superior to that of conventional all-rigid boards. In the typical rigid-flex assembly, the electrical interconnections between separate parts of the assembly are made through a flexible conductor, typically a multi-conductor ribbon cable terminating in and integral with a subassembly at one or both ends of the cable. To provide the required thermal isolation between a warm and a cold subassembly, the interconnecting cable must possess low thermal conductivity and acceptable electrical conductivity characteristics. A typical approach to satisfy these requirements is the judicious selection of conductor material to be used in the cable. One such conductor material is stainless steel. However, in a typical configuration wherein the cable conductors are integral with either or both terminating subassemblies and a continuous path of the same conductor material extends into the terminating subassemblies, the use of stainless steel can present a problem. This is because voids or separations develop at the interface joint between the stainless steel and the copper plating in the through-holes during formation of conductive feedthrus used to interconnect the various conductive printed circuit layers to the stainless steel conductor layer which serves to terminate the cable assembly. To realize effective through-hole copper electroplating, a good preplating electrical path must be provided. Typically, for copper to copper joints, electroless (chemical) copper deposition is used for pre-plating. For stainless steel to copper joints, an inadequate pre-plating path frequently results, because, typically, the electroless copper adheres poorly to the stainless steel. This subsequently results in a copper electroplating which is inadequate, particularly at the copper/stainless steel interface, because of the presence of voids in the electroplating which voids give rise to electrical open circuits.

SUMMARY OF THE INVENTION

It is, therefore, an object of the present invention to provide an apparatus for, and method of, limiting the transfer of heat energy through electrical conductors connecting rigid circuit systems at differing temperatures. It is a further object to provide a flexible electrical interconnect between such rigid circuit systems which has low thermal conductivity.

It is a further object to provide for a flexible, low thermal conductivity cable type interconnect between rigid circuit board systems in a rigid-flex circuit apparatus to minimize heat energy flow along that interconnect.

It is a still further object to provide methods of interconnecting first and second rigid circuit systems with a flexible electrically conductive path which minimizes heat transfer therebetween.

These and other objects of the invention, to become apparent hereafter, are realized in an apparatus adapted for flexible electrical interconnection between first and second rigid circuit systems, the systems being desirably isolated thermally from each other against heat energy tending undesirably to transfer between the systems, comprising in combination, a first flexible electrical conductor extending outwardly of the first circuit system to terminate in a first end, a second flexible electrical conductor extending outwardly of the second circuit system to terminate in a second end, and a third flexible electrical conductor bridging at least the first and second ends to provide the flexible electrical interconnection between the first and second systems and characterized by low thermal conductivity relative to at least one of the first and second conductors to thermally isolate the systems. Typically, at least one of the first and second conductors further comprises a conductor portion as a continuation of the respective flexible conductor extending inwardly of and integral with its respective rigid circuit system defining circuit system printed circuitry. Typically, the third conductor is comprised of a material selected from stainless steel, constantan, and manganin. Desirably, at least one of the first and second conductors is comprised of copper and the third conductor is comprised of stainless steel. Typically, at least one of the first and second electrical conductors is comprised of a first material, the third conductor is comprised of a second material, and the ratio of the electrical conductivities of the first material to the second material is less than 100 and the ratio of the thermal conductivities of the first material to the second material is greater than 10, both at 300°K.

In another embodiment of the present invention there is provided a rigid-flex circuit apparatus having first and second rigid circuit board systems electrically interconnected by a flexible cable, the circuit systems being desirably isolated thermally from each other against heat energy tending undesirably to transfer between systems by way of the cable, comprising in combination, a first flexible copper conductor integral with and extending outwardly of the first circuit system to terminate in a first end, a second flexible copper conductor integral with and extending outwardly of the second circuit system to terminate in a second end, and a third flexible stainless steel conductor bridging at least the first and second ends to provide a flexible electrical interconnection between the first and second circuit systems wherein the stainless steel conductor is characterized by low thermal conductivity relative to the first and second copper conductors to thereby thermally isolate the circuit systems.

In another embodiment of the present invention, there is provided a method of interconnecting first and second rigid circuit systems with a flexible electrically conductive path which minimizes heat transfer therebetween, comprising the steps of, extending a first flexible electrical conductor outwardly of the first circuit system to terminate in a first end, extending a second flexible electrical conductor outwardly of the second circuit system to terminate in a second end, and bridging the first and second ends with a flexible electrical conductor of material characterized by low thermal conductivity to provide thermal isolation between the systems.

In a further embodiment of the present invention, there is provided a method of flexibly interconnecting first and second rigid circuit systems by means of a thermally isolating electrical conductor having first, second, and third electrically conductive segments serially connected end to end, the second segment of material characterized by low thermal conductivity intermediately positioned between the first and third segments to minimize heat transfer between the circuit systems, comprising the steps of, providing a flexible stainless steel foil having a top surface, plating a thin copper layer having a bottom surface to the stainless steel foil top surface wherein the layer bottom surface is adjacent to the foil top surface, etching the stainless steel foil to form a region of stainless steel foil defining the second electrically conductive segment and leaving the copper layer substantially unaltered, bonding a thin polyimide film to the copper layer bottom surface in coextension therewith to underlay the second conductive segment and copper layer to provide structural support therefor, etching the copper layer to form the first and third electrically conductive segments integral with and extending outwardly from the first and second circuit systems, respectively, to terminate in first and second ends, respectively, in bridged relation to the second electrically conductive segment to provide electrical conduction and thermal isolation between the first and second circuit systems.

BRIEF DESCRIPTION OF THD DRAWINGS

The invention will be further described as to an illustrative embodiment in conjunction with the attached drawings in which.

DESCRIPTION OF THE PREFERRED EMBODIMENT

There is shown in the sequence of figures, FIGS. 1 through 5 described above, the preferred embodiment of the present invention.

Figure 1:
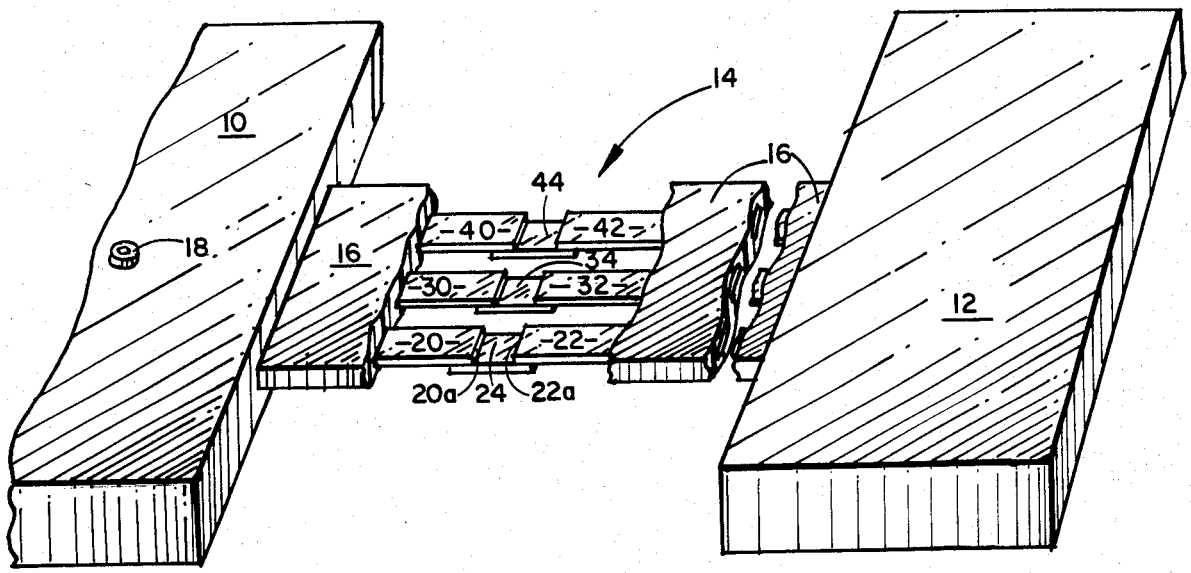
FIG. 1 is an exaggerated perspective view, partial section and partial elevation, of an interconnected circuit board apparatus in accordance with the present invention.

In FIG. 1, there is shown a rigid-flex circuit board apparatus in accordance with the present invention. The major components of the apparatus are a first rigid circuit board system 10, a second rigid circuit board system 12, and a flexible electrical interconnection 14 in the form of a flexible multi-conductor ribbon cable, where the components are arranged desirably to thermally isolate the first board system and the second board system from each other against heat energy tending undesirably to transfer between the systems by way of the flexible cable. Broad details of the ribbon cable 14 are illustrated in the cutaway-view portion of the drawing. Shown there are the cable insulation 16, portions of which are cut away, a first terminating end 20a of a first flexible electrical conductor 20 extending outwardly of the first circuit board system 10, a second terminating end 22a of a second flexible electrical conductor 22 extending outwardly of the second circuit board system 12, and a third flexible electrical conductor 24 bridging at least the terminating ends 20a, 22a to provide flexible electrical interconnection between the first and second circuit board systems. The material of the third flexible conductor 24 is characterized by a thermal conductivity which is much less than the material of at least one of the first and second conductors 20, 22, thereby providing resistance to heat transfer while maintaining electrical conductivity along the circuit path linking the circuit systems 10, 12. In a like manner, flexible electrical conductor pairs 30, 32 and 40, 42 are shown connected by low thermal conductivity bridging conductors 34 and 44, respectively, to provide two additional thermally isolating conductive circuit paths between the circuit systems 10, 12. To achieve effective thermal isolation while maintaining good electrical conductivity between the circuit board systems, 10, 12, appropriate material selection and dimensional design for the bridging flexible conductors 24, 34, 44 are required. Where the material for the flexible conductors 20, 22, 30, 32, 40, 42 is copper, typically, the material for the bridging conductors 24, 34, 44 is stainless steel. Other materials, such as constantan and manganin, can also be used for the bridging conductor. Table I presents typical values of the electrical and thermal conductivities at 300°K of copper, stainless steel, constantan and copper. Also presented in the table are the ratios of the electrical conductivity of copper to the electrical conductivity of each of the other materials, and the ratios of the thermal conductivity of copper to the thermal conductivity of each of the other materials.

TABLE I

| Electrical and Thermal Conductivities, and Relative Conductivities With Respect to Copper at 300° K. | | | | |
|---|---|---|---|---|
| Material | Elect. Cond., $\sigma$ (Approx.) $10^5$ mho-cm | $\dfrac{\sigma_{cu}}{\sigma_{other}}$ | Therm. Cond., K. (Approx.) $\dfrac{\text{cal-cm}}{\text{cm}^2\text{-sec-°C.}}$ | $\dfrac{K_{cu}}{K_{other}}$ |
| Annealed Copper, 99.95% Cu | 5.81 | 1.00 | .931 | 1.00 |
| Stainless Steel, 300 Series | 0.139 | 41.8 | .04 | 23.27 |

TABLE I-continued

Electrical and Thermal Conductivities, and Relative Conductivities With Respect to Copper at 300° K.

| Material | Elect. Cond., $\sigma$ (Approx.) $10^5$ mho-cm | $\dfrac{\sigma_{cu}}{\sigma_{other}}$ | Therm. Cond., K. (Approx.) cal-cm cm²-sec-°C. | $\dfrac{K_{cu}}{K_{other}}$ |
|---|---|---|---|---|
| Constantan | 0.204 | 28.5 | .051 | 18.25 |
| Magnanin | 0.207 | 28.1 | .064 | 14.5 |

Also shown in FIG. 1 is a portion of a typical electrically conductive feedthru 18 which provides selective electrical interconnection between insulated layers (not shown) of electrically conductive printed circuitry disposed in circuit board system 10.

Figure 2:
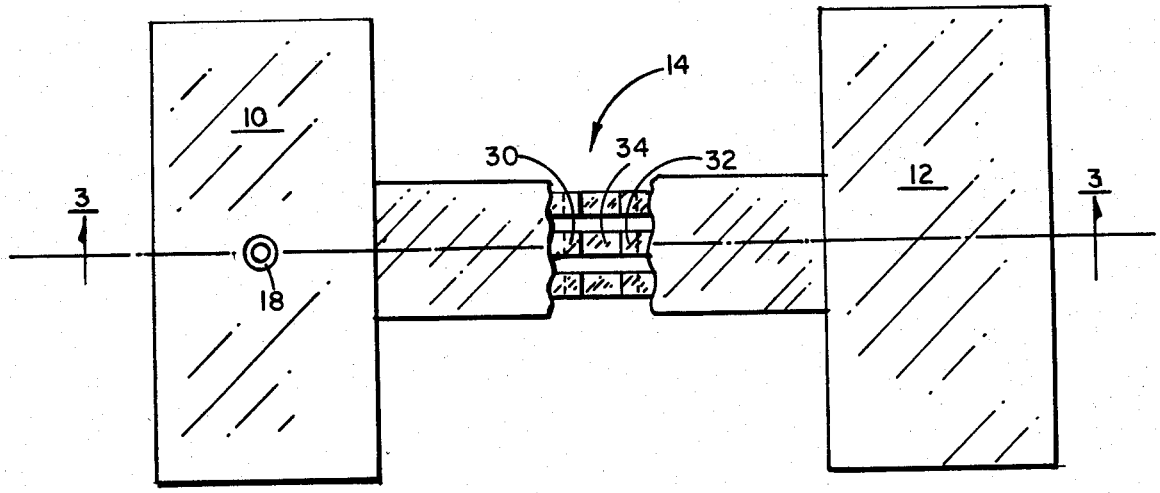
FIG. 2 is a top plan view of the apparatus shown in FIG. 1.
Figure 3:
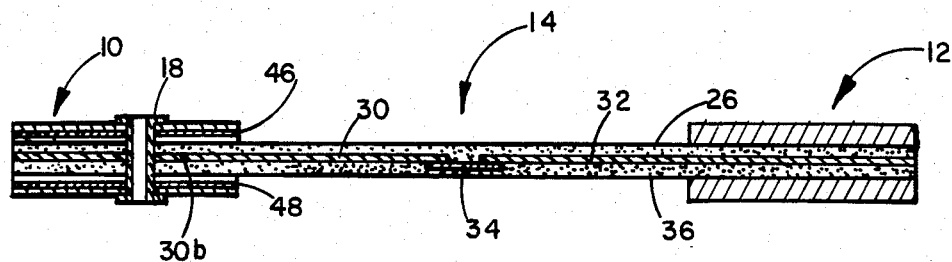
FIG. 3 is a cross section of the apparatus taken along the line 3—3 of FIG. 2.

FIG. 2 presents a plan view of the rigid-flex apparatus of FIG. 1 and FIG. 3 presents a sectional view along the line 3—3 of FIG. 2. Shown in FIGS. 2 and 3 are the first board system 10, the second board system 12 and the interconnecting flexible cable 14. Also shown are the conductors 30, 32 and the bridging conductor 34 together forming one of the electrically conductive paths between the board systems 10, 12. Shown interposed between layers 46, 48 of printed circuitry in FIG. 3 is the continued extent part 30b of the conductor 30, which continued extent part is further shown to be selectively interconnected to the printed circuitry through the conductive feedthru 18.

Figure 4:
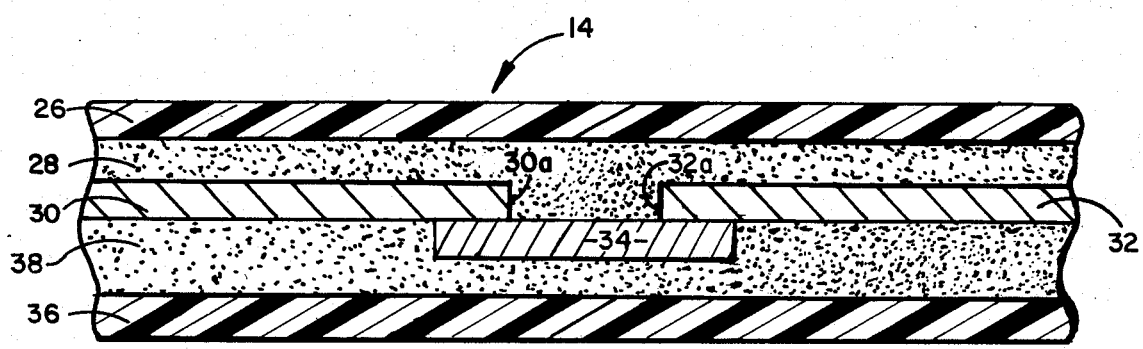
FIGS. 4 and 5 are expanded cross section and perspective views of the sectional view of FIG. 3 showing the details of the layered structure of the interconnecting conductor and of the through hole in one circuit board, respectively.

The layered structure of the flexible ribbon cable 14, particularly the part of the cable wherein the ends 30a, 32a of the conductors 30, 32, respectively, are joined to the bridging conductor 34, is presented in greater detail in FIG. 4. To provide electrical insulation and structural support in the foil-like conductor comprised of conductor 30, 32 and bridging conductor 34, external layers of flexible insulation 26, 36 such as a polyimide film are bonded to opposing surfaces of the foil-like conductor by adhesive layers 28, 38. In a preferred embodiment, conductors 30, 32 are copper and conductor 34 is stainless steel.

Figure 5:
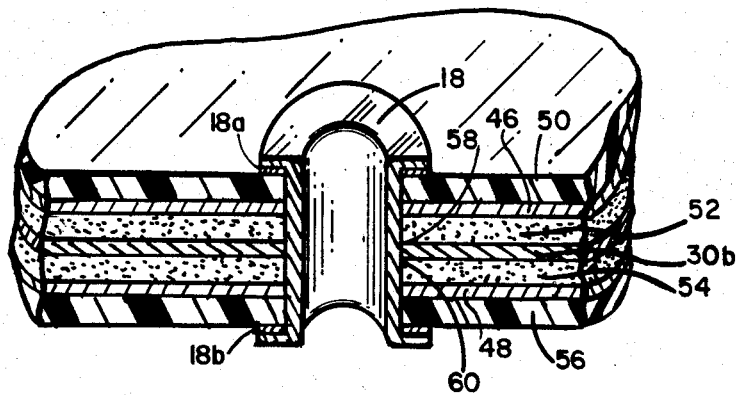

In FIG. 5, there is presented an expanded perspective view, partial section and partial elevation, of the layered structure of the circuit board system 10 (see FIG. 3) in the region surrounding and including the conductive feedthru 18. The layer parts 18a, 18b of the feedthru 18 are conductive printed circuit pads, typically etched from a layer of copper cladding, which serves to locate the feedthru. The electrically conductive layers 46, 30b, 48 are shown insulated from each other (except for the feedthru 18) by the insulating layers 52, 54 and externally insulated and protected by layers 50, 56. In particular, the conductive layer 30b corresponds to a continuous extension of the conductor 30 (see FIGS. 1 thru 4) as an integral part of the circuit board system 10. Layers 46, 48 are portions of printed circuitry disposed in the circuit board system 10. Particular attention is directed to the circular interface joint regions 58, 60 where the conductive layer 30b makes electrical connection to the feedthru 18. Conventional plating technology favors use of copper plating to realize the conductive feedthru 18. Where connection is to be made to a non-copper layer 30b, less than optimum interface joint regions 58, 60 are realized, leading to voids, poor connections, and open circuits. This is particularly true, where the layer 30b is made from stainless steel, such as could be the case to provide isolation of the first circuit board system 10 from the second circuit board system 12 (see FIG. 3). However, in accordance with the present invention, thermal isolation can nonetheless be provided without the necessity of making the entire layer 30b from stainless steel. Rather, the preferred embodiment uses copper in the layer 30b, with stainless steel introduced only in the bridging conductor 34 as shown in FIGS. 1 through 4. Further, this allows for a copper to copper interface at the joint regions 58, 60. Certain details of this embodiment can be altered, e.g., other materials such as constantan and manganin may be used in the bridging conductors 24, 34, 44 of the interconnecting cable, while still retaining the advantages of the invention over the prior art.

Figure 6:
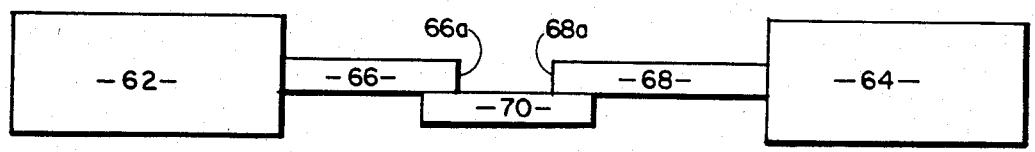
FIG. 6 is an exaggerated end view for steps of a method embodying the present invention.

In FIG. 6, there is shown a method of interconnecting circuit systems in accordance with the present invention. The method steps comprise extending a first flexible electrical conductor 66 outwardly of a first circuit system 62 to terminate in a first end 66a, extending a second flexible electrical conductor 68 outwardly of a second circuit system 64 to terminate in a second end 68a, and bridging the first and second ends 66a, 68a with a flexible electrical conductor 70 of material characterized by low thermal conductivity to provide the desired thermal isolation between the systems 62, 64.

Figure 7A:
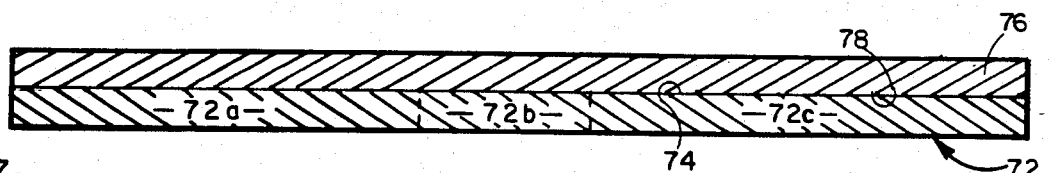
FIGS. 7a through 7f are exaggerated cross section views for various steps of a method embodying the present invention.
Figure 7B:
Figure 7C:
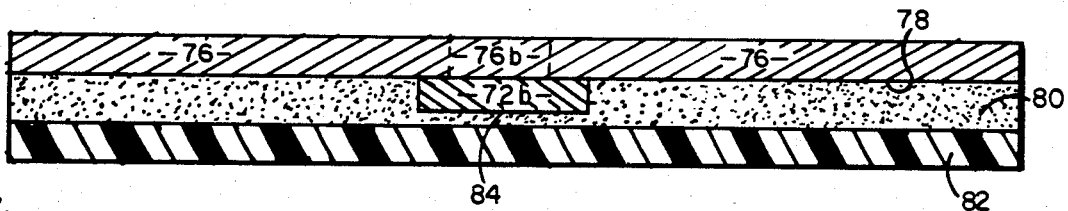
Figure 7D:
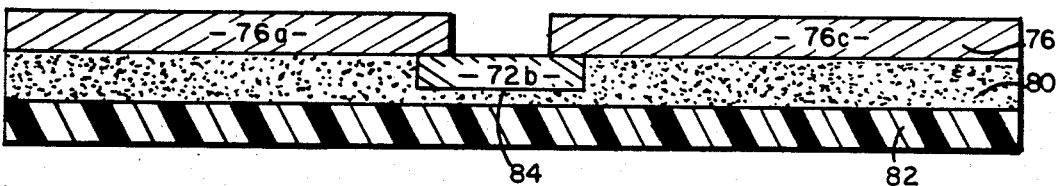
Figure 7E:
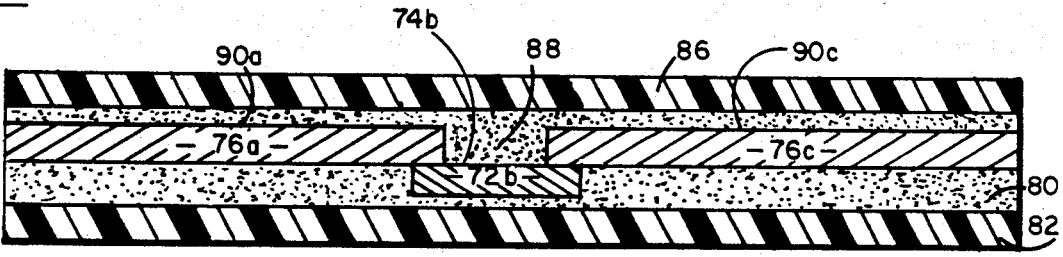
Figure 7F:
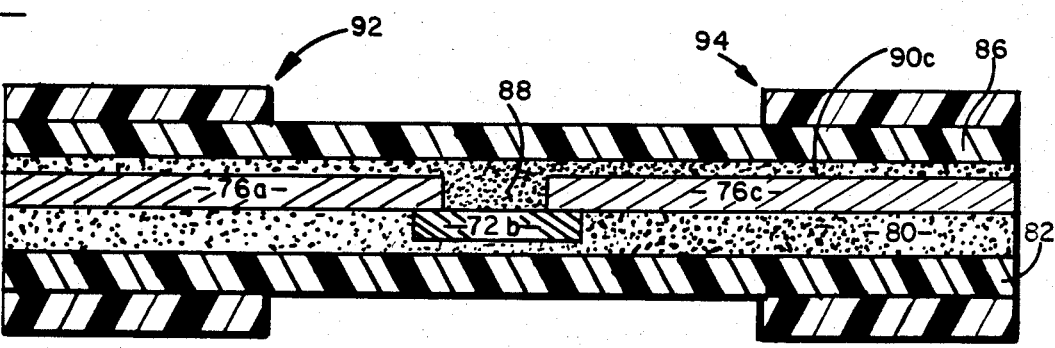

In another more detailed method of flexibly interconnecting circuit systems we turn to FIGS. 7a through 7f. Shown in FIG. 7a is the originating step showing in cross section, a stainless steel foil 72 delineated into regions 72a, 72b, and 72c, and having a top surface 74. Next, the foil 72 is plated on its upper surface 74 with a layer 76 of copper wherein the lower surface 78 of the copper layer is adjacent to the upper surface 74 of the stainless steel foil resulting in the configuration shown in FIG. 7a. Next, regions 72a and 72c are etched away using conventional metal etching processes as shown in FIG. 7b, leaving the center stainless steel region 72b, also referred to hereinafter as the second electrically conductive segment, or second segment, or stainless steel segment. This is followed by bonding an insulative film layer 82, typically a polyimide material, to the bottom surface 78 of the copper layer 76 and to the bottom surface 84 of the stainless steel segment 72b using the adhesive 80, as shown in FIG. 7c. This is followed by etching away the central region 76b of the copper layer 76 (shown in FIG. 7c) using a conventional metal etching process, leaving the regions 76a and 76c, also referred to hereinafter as the first and third electrically conductive segments, respectively, or first and third segments, respectively, flanking the removed region 76b resulting in the configuration shown in FIG. 7d. Because of the electrical conductivity characteristics of the stainless steel segment 72b and the conductivity of the flanking regions 76a, 76c, a continuous electrical path is provided from one end to the other of the combination conductor comprising first, second, and third segments 76a, 72b, 76c, while maintaining a degree of thermal isolation between the opposite ends of this combination conductor in accordance with the objects of the invention. In FIGS. 7e and 7f, additional structural steps are presented, showing the completed configuration though these latter steps as shown in FIG. 7e and 7f, are not necessary steps of the invention. These latter figures and the steps to which they relate are presented only for illustrative purposes only to give an indication of the completed circuit board system in a typical application. The next step, then, is to bond another insulative thin film layer 86, typically a polyimide film material, to the upper surface 90a of the conductor 76a and the upper surface 90c of the conductor 76c and the upper surface 74b of the stainless steel segment 72b as shown in FIG. 7e. In FIG. 7f, a typical completed configuration is illustrated showing first rigid circuit board system 92 and a second rigid circuit board system 94 electrically interconnected by the flexible conductive segment combination 76a, 72b, 76c, the conductive segments 76a, 76c being integral with the first and second circuit board systems, respectively.

Each of the above embodiments is illustrative of the invention and not restrictive, the scope of the invention being limited only by the appended claims.

It will be noted that in accordance with objects of the invention, an apparatus for, and method of, limiting the transfer of heat energy through electrical conductors connecting rigid circuit systems at differing temperatures is realized. Also provided is a flexible electrical interconnect between such rigid circuit systems which has low thermal conductivity. Provided also is a flexible, low thermal conductivity cable type interconnect between rigid circuit board systems in a rigid flex circuit apparatus to minimize heat energy flow along that interconnect. Also provided are methods of interconnecting first and second rigid circuit systems with a flexible electrically conductive path which minimizes heat transfer therebetween.

What is claimed is:

1. An apparatus in flexible electrical interconnection between first and second rigid circuit systems, said systems being desirably isolated thermally from each other against heat energy tending undesirably to transfer between said systems, comprising in combination:
    a first flexible electrical conductor extending outwardly of a first rigid circuit system to terminate in a first end;
    a second flexible electrical conductor extending outwardly of a second rigid circuit system to terminate in a second end; and
    a third flexible electrical conductor bridging at least said first and second ends to provide said flexible electrical interconnection between said first and second systems and characterized by low thermal conductivity relative to at least one of said first and second conductors to thermally isolate said systems.

2. Apparatus according to claim 1, in which at least one of said first and second conductors further comprises a conductor portion as a continuation of said respective flexible electrical conductor extending inwardly of and integral with its respective said rigid circuit system defining circuit system printed circuitry.

3. Apparatus according to claim 1, in which said third conductor is comprised of a material selected from stainless steel, constantan, and manganin.

4. Apparatus according to claim 1, in which at least one of said first and second conductors is comprised of copper and said third conductor is comprised of stainless steel.

5. Apparatus according to claim 1, in which at least one of said first and second electrical conductors is comprised of a first material, said third conductor is comprised of a second material, and the ratio of the electrical conductivities of said first material to said second material is less than 100 at 300°K.

6. Apparatus according to claim 1, in which at least one of said first and second electrical conductors is comprised of a first material, said third conductor is comprised of a second material, and the ratio of the thermal conductivities of said first material to said second material is greater than 10 at 300°K.

7. Apparatus according to claim 6, in which the ratio of the electrical conductivities of said first material to said second material is less than 100 at 300°K.

8. Apparatus according to claim 7, in which at least one of said first and second conductors further comprises a conductor portion as a continuation of said respective flexible electrical conductor extending inwardly of and integral with its respective said rigid circuit system defining circuit system printed circuitry.

9. Apparatus according to claim 8, in which said second material is selected from stainless steel, constantan, and manganin.

10. Apparatus according to claim 9, in which at least one of said first and second conductors is comprised of copper and said third conductor is comprised of stainless steel.

11. A rigid-flex circuit apparatus having first and second rigid circuit board systems electrically interconnected by a flexible cable, said circuit systems being desirably isolated thermally from each other against heat energy tending undesirably to transfer between said systems by way of said cable, comprising in combination:
    a first flexible copper conductor integral with and extending outwardly of said first circuit system to terminate in a first end;
    a second flexible copper conductor integral with and extending outwardly of said second circuit system to terminate in a second end; and
    a third flexible stainless steel conductor bridging at least said first and second ends to provide a flexible electrical interconnection between said first and second circuit systems wherein said stainless steel conductor is characterized by low thermal conductivity relative to said first and second copper conductors to thereby thermally isolate said circuit systems.

* * * * *